(12) United States Patent
Butzmann

(10) Patent No.: US 7,948,419 B2
(45) Date of Patent: May 24, 2011

(54) CIRCUIT CONFIGURATION FOR OBTAINING A BINARY OUTPUT SIGNAL

(75) Inventor: Stefan Butzmann, Beilstein (DE)

(73) Assignee: NXP B.V., Eindhoven (NL)

( * ) Notice: Subject to any disclaimer, the term of this patent is extended or adjusted under 35 U.S.C. 154(b) by 144 days.

(21) Appl. No.: 11/993,323

(22) PCT Filed: Jun. 28, 2006

(86) PCT No.: PCT/IB2006/052155
§ 371 (c)(1),
(2), (4) Date: Jul. 26, 2010

(87) PCT Pub. No.: WO2007/000746
PCT Pub. Date: Jan. 4, 2007

(65) Prior Publication Data
US 2010/0321224 A1 Dec. 23, 2010

(30) Foreign Application Priority Data
Jun. 29, 2005 (EP) .................... 05105780

(51) Int. Cl.
*H03M 1/12* (2006.01)

(52) U.S. Cl. ...................... 341/155; 341/156

(58) Field of Classification Search .......... 341/155, 341/143, 156; 327/50–52, 54, 56
See application file for complete search history.

(56) References Cited

U.S. PATENT DOCUMENTS

| 6,096,187 | A | 8/2000 | Mizoguchi et al. |
| 7,098,827 | B2 * | 8/2006 | Motz ............... 341/143 |
| 2002/0100866 | A1 | 8/2002 | Butka et al. |
| 2005/0275575 | A1 * | 12/2005 | Motz ............... 341/143 |

FOREIGN PATENT DOCUMENTS

| EP | 0919789 A1 | 6/1999 |
| FR | 2860587 A1 | 4/2005 |

* cited by examiner

*Primary Examiner* — Jean B Jeanglaude

(57) ABSTRACT

A circuit configuration for obtaining a binary output signal from a current signal delivered by a magnetic-field sensor comprises a magnetic-field sensor, a voltage-supply unit, a measuring device, a signal-conditioning stage, a control stage, wherein the signal values represent the two current values of the current signal, alternating in pulse shape, as supplied by the magnetic-field sensor, for supplying the currently obtained first and second signal values to a memory device after every pulse-shaped change in the current signal and for identifying a digital changeover-threshold signal in accordance with a first algorithm from the real-time first and second signal values, the memory device for storing the currently obtained first and second signal values, a digital/analogue converter stage, and a comparator.

14 Claims, 1 Drawing Sheet

CIRCUIT CONFIGURATION FOR OBTAINING A BINARY OUTPUT SIGNAL

The invention relates to a circuit configuration for obtaining a binary output signal from a current signal delivered by a magnetic-field sensor.

Current interfaces for the transmission of signals represent a preferred solution in many automotive applications. Anti-lock braking systems represent such an application. In comparison with voltage interfaces, they exhibit greater immunity from interference, greater reliability in detecting interruptions at the supply-voltage terminal or the ground cable, and the advantage of being able to omit a third conductor connection for the transmission of voltage signals.

Transmitted in a binary current interface is a current signal essentially alternating in pulse shape between two current values.

One disadvantage of binary current interfaces of this kind lies in the fact that these current values can be realized only with relatively great tolerances. This gives rise to the necessity of providing a relatively great current difference between these two current values in order to distinguish the two current values reliably for the reproduction of a binary signal. If the higher of the current values then has to be transmitted in operation over a lengthy period, this leads to an increased power consumption. If the current signal is supplied by a magnetic-field sensor, the sensor hereby heats up to an unusual extent. This restricts the ambient-temperature range in which the magnetic-field sensor can be used, or requires adherence to a very low level for the lower of the two current values by way of compensation. A current-sensing resistor with a high resistance value could in fact be used to detect the current values, enabling the voltage occurring via the magnetic-field sensor to be reduced on transmission of the higher of the two current values. On the other hand, however, if a current-sensing resistor with a high resistance value is used, the supply voltage would have to be increased in order that, when the higher of the two current values is transmitted, the magnetic-field sensor can still be supplied with the minimum voltage necessary for its operation. This would, however, result in an unnecessarily high voltage at the sensor during transmission of the lower of the two current values.

Known from U.S. Pat. No. 6,096,187 is a measuring device for an oxygen sensor for determining an air/fuel mixture ratio. A voltage-supply unit supplies electrodes of a detecting apparatus for air/fuel mixture ratios with a specified voltage when the air/fuel mixture ratio is to be detected. To this end, a first voltage obtained from a constant supply voltage via a first resistance voltage divider is supplied to the non-inverting input of a first operational amplifier. A second voltage, obtained from the constant supply voltage via a second resistance voltage divider is supplied to the non-inverting input of a second operational amplifier. The first and the second voltages are directed to electrodes of the detecting apparatus for air/fuel mixture ratios via the first and second operational amplifier respectively. A current flowing through the detecting apparatus for air/fuel mixture ratios is detected with the aid of a current-sensing resistor and output to a microcomputer via an A/D converter.

It is an object of the invention to create a circuit configuration for obtaining a binary output signal from a current signal delivered by a magnetic-field sensor, by means of which the power consumption of the magnetic-field sensor can be minimized.

This object is achieved in accordance with the invention in that a circuit configuration of this kind comprises:

A magnetic-field sensor, which is supplied at two terminals with a supply voltage and which delivers from these terminals a current signal essentially alternating in pulse shape between two current values.

A voltage-supply unit to supply the magnetic-field sensor with a stabilized supply voltage.

A measuring device for tapping the pulse-shaped current signal from the magnetic-field sensor and for delivering a measuring signal.

A signal-conditioning stage for forming an analogue voltage signal from the measuring signal.

An analogue/digital converter stage for obtaining a digital voltage signal from the analogue voltage signal.

A control stage:

for obtaining a first and a second signal value from the digital voltage signal, wherein the signal values represent the two current values of the current signal, alternating in pulse shape, as supplied by the magnetic-field sensor.

for supplying the currently obtained first and second signal values to a memory device after every pulse-shaped change in the current signal.

for identifying a digital changeover-threshold signal in accordance with a first algorithm from the real-time first and second signal values.

The memory device for storing the currently obtained first and second signal values.

A digital/analogue converter stage for obtaining an analogue changeover-threshold signal from the digital changeover-threshold signal.

A comparator for comparing the analogue voltage signal with the analogue changeover-threshold signal and for creating the binary output signal in accordance with this comparison.

Using the circuit configuration in accordance with the invention, the difference between the two current values of the current signal alternating in pulse shape, as necessary for the proper recognition of the current values and for distinguishing between them, can also be advantageously reduced to a minimum.

The circuit configuration in accordance with the invention represents an active receiver circuit for current interfaces. The receiver circuit undertakes the task of maintaining the voltage supplied to the magnetic-field sensor at a constant level. The current values delivered by the magnetic-field sensor are measured in operation and logged. The optimum value for the changeover-threshold signal is determined from the stored current values and used for detecting or distinguishing between the current values delivered by the magnetic-field sensor. This enables the said adjustment of the difference in these current values to a minimum.

In accordance with an advantageous further embodiment of the circuit configuration in accordance with the invention, the control stage is further equipped for the creation of an error signal in accordance with a second algorithm in the event that the first and second signal values obtained lie outside a specifiable tolerance range, and for delivery of this error signal to an error-signal output. Error recognition can hereby be realized in simple fashion.

In accordance with another embodiment of the invention, the control stage is further equipped for the creation, in accordance with a third algorithm, of a supply-voltage control signal from the first and second signal values obtained, and the supply-voltage control signal is supplied to the voltage-supply unit for controlling the supply voltage to a minimum possible value for the error-free creation of the output signal. A further reduction in power consumption of the magnetic-field sensor can hereby be advantageously obtained without any losses in recognition of the signal values.

The voltage-supply unit preferably comprises an amplifier stage, with feedback via the measuring device, to supply the stabilized supply voltage.

To form the analogue voltage signal from the measuring signal, the signal-conditioning stage advantageously comprises a voltage-divider device with a series circuit containing a zener diode and a resistor, wherein the measuring signal is supplied to the series circuit and the analogue voltage signal is tapped off at the resistor. In a different embodiment, to form the analogue voltage signal from the measuring signal, the signal-conditioning stage comprises a high-pass circuit, to the input of which the measuring signal is supplied, and from the output of which the analogue voltage signal is delivered.

The invention thus makes available a concept for a current interface by means of which a significant reduction in the power consumption of the magnetic-field sensor is achieved. The ambient-temperature range permitted for the operation of the magnetic-field sensor can thereby be increased. This is extremely advantageous for an application in the field of automotive electronics in particular. In addition, the concept enables an "intelligent" current interface with "intelligent" error recognition.

The invention will be further described with reference to examples of embodiments shown in the drawings, to which, however, the invention is not restricted.

Figure 1:
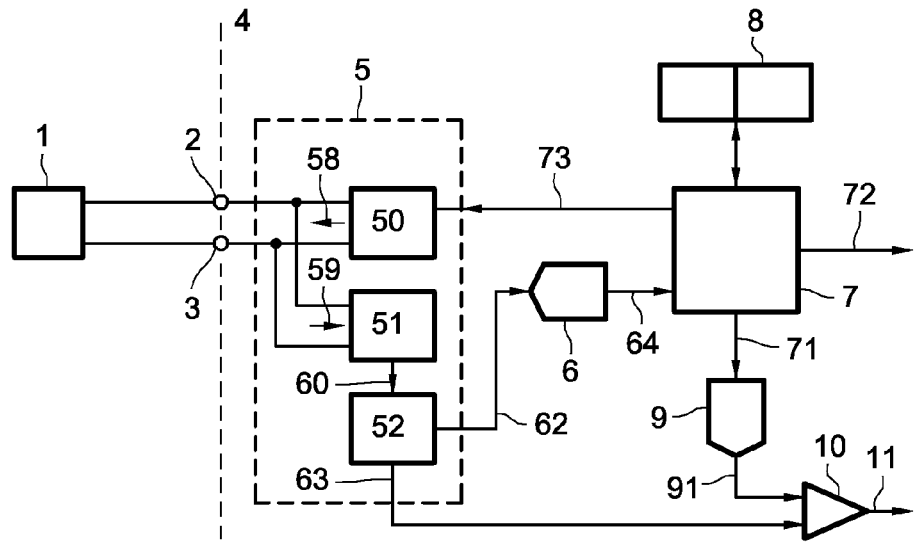
FIG. 1 shows a block circuit diagram of one embodiment of the circuit configuration in accordance with the invention.

In FIG. 1, reference number 1 indicates a magnetic-field sensor, which is equipped with a first and a second terminal, 2 and 3 respectively. A stabilized supply voltage is supplied to the magnetic-field sensor 1 via the terminals 2, 3. From these terminals 2, 3 the magnetic-field sensor also delivers a current signal essentially alternating in pulse shape between two current values.

Connected to the terminals 2, 3 is a circuit unit designated with reference number 5, containing a voltage-supply unit 50 for supplying the magnetic-field sensor 1 with the supply voltage, a measuring device 51 for tapping-off the pulse-shaped current signal from the magnetic-field sensor 1 and for delivering a measuring signal, and a signal-conditioning stage 52 for forming an analogue voltage signal from the measuring signal. To supply the magnetic-field sensor 1 with the stabilized supply voltage, symbolized by an arrow 58, the terminals 2, 3 are routed to the voltage-supply unit 50. For tapping-off the pulse-shaped current signal from the magnetic-field sensor 1, the terminals 2, 3 are further routed to the measuring device 51, symbolized in FIG. 1 by an arrow 59.

For delivering the measuring signal to the signal-conditioning stage 52, the latter is connected via a connection 60 to the measuring device 51. The analogue voltage signal is delivered by the signal-conditioning stage 52 to a first and a second output 62, 63 respectively.

Figure 2:
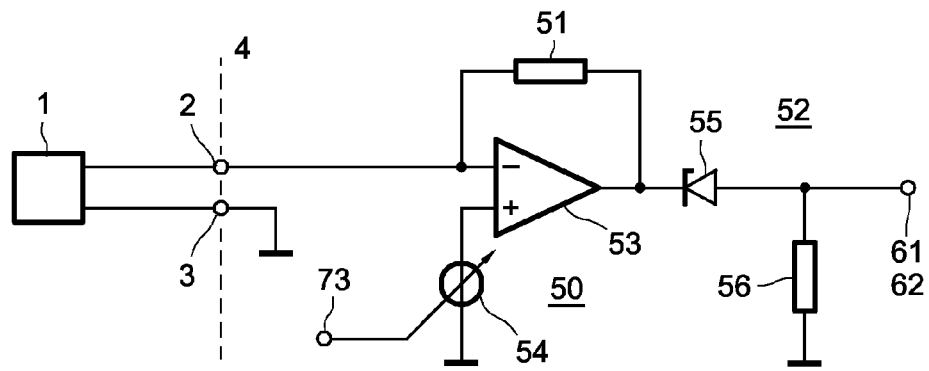
FIG. 2 shows a first embodiment example of a voltage-supply unit, a measuring device and a signal-conditioning stage for use in the circuit configuration in accordance with the invention.

FIG. 2 shows a first embodiment example of a voltage-supply unit 50, a measuring device 51 and a signal-conditioning stage 52 interconnected with the magnetic-field sensor 1 for use in the circuit configuration in accordance with the invention. The voltage-supply unit 50 herein comprises an amplifier configuration 53, preferably an operational amplifier, the inverting input of which is connected to the first terminal 2 of the magnetic-field sensor 1, and the non-inverting input of which is connected to ground via a reference-voltage source 54. From its output, the amplifier configuration 53 is fed back to the inverting input via the measuring device 51, here taking the form of an ohmic measuring resistor. This configuration enables the stabilized supplying of the magnetic-field sensor 1 with the voltage delivered by the reference-voltage source 54. The pulse-shaped current signal from the magnetic-field sensor 1 flows via the measuring resistor 51 to the output of the amplifier configuration 53.

In the configuration shown in FIG. 2, the signal-conditioning stage 52 for forming an analogue voltage signal from the measuring signal comprises a series circuit containing a zener diode 55 and a resistor 56. One end point of this series circuit 55, 56 is connected to the output of the amplifier configuration 53 and the other end point is routed to ground. Since the voltage potential of the inverting input of the amplifier configuration 53 is stabilized to the value of the voltage delivered by the reference-voltage source 54 irrespective of the pulse-shaped signal deriving from the magnetic-field sensor 1, a voltage proportional to the pulse-shaped current signal flowing via the measuring resistor 51 is routed to the series circuit 55, 56, this voltage representing the measuring signal. At the resistor 56, the analogue voltage signal is tapped-off via a tap 61. The zener diode 55 hereby serves for the potential displacement of the analogue voltage signal, e.g. for generating a level appropriate to a downstream TTL logic circuit.

Figure 3:
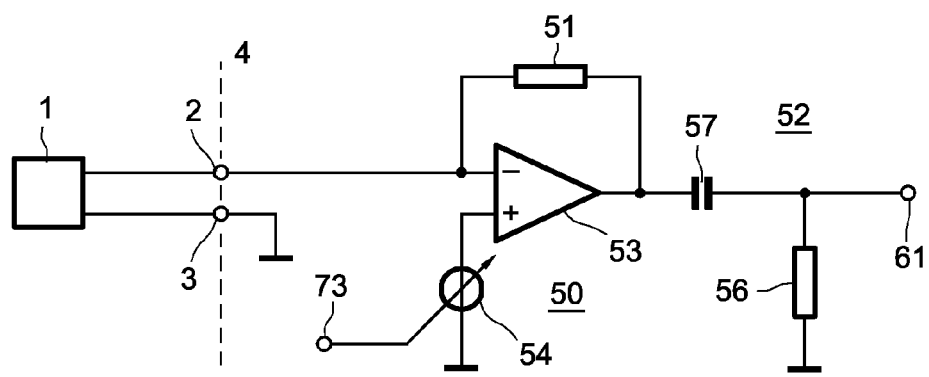
FIG. 3 shows a second embodiment example of a voltage-supply unit, a measuring device and a signal-conditioning stage for use in the circuit configuration in accordance with the invention Where the same components appear in different Figures, the same reference numbers have been used.

FIG. 3 shows a second embodiment example of a voltage-supply unit 50, a measuring device 51 and a signal-conditioning stage 52 interconnected with the magnetic-field sensor 1 for use in the circuit configuration in accordance with the invention. With the exception of the design of the signal-conditioning stage 52, this embodiment example corresponds with that shown in FIG. 2. The zener diode 55 has here been replaced by a capacitor 57, with the result that the signal-conditioning stage now comprises a high-pass circuit, to the input of which the measuring signal is routed, and from the output of which the analogue voltage signal is delivered. In this embodiment, the analogue voltage signal contains only the signal changes; preferably, only the transitions from high to low signal values are detected.

The circuit configuration shown in FIG. 1 further comprises an analogue/digital converter stage 6, to which the analogue voltage signal from a first output 62 of signal-conditioning stage 52, which comprises, for example, the described tap 61, is sent. In the analogue/digital converter stage 6, a digital voltage signal is obtained from the analogue voltage signal and routed to a control stage 7 via a line 64.

In the control stage 7, a first and a second signal value are obtained from the digital voltage signal, wherein the signal values represent the two current values, as delivered by the magnetic-field sensor (1), of the current signal alternating in pulse shape or the measuring signal derived therefrom. Peak-value detection based on the digital voltage signal is preferably undertaken hereby. The first and second signal values currently obtained after every pulse-shaped change in the current signal and thereby in the digital voltage signal are routed to a memory device 8 where they are stored. A digital changeover-threshold signal is further determined in accordance with a first algorithm from the stored current first and second signal values. In the simplest case, this determination is made by averaging, but scatter over time of the first and second signal values, non-linearity etc. may be taken into account, enabling an extremely precise determination of the digital changeover-threshold signal. The digital changeover-threshold signal is delivered from the control stage 7 via a line 71.

The circuit configuration shown in FIG. 1 further comprises a digital/analogue converter stage 9, to which the digital changeover-threshold signal from the control stage 7 is routed via the line 71, and in which an analogue changeover-threshold signal is obtained therefrom by digital/analogue conversion. This is available at the output 91 of the digital/analogue converter stage 9.

From the signal-conditioning stage 52, the analogue voltage signal is further delivered via a second output 63, which may, for example, also take the form of the described tap 61, and routed to a first input of a comparator device 10. The analogue changeover-threshold signal is routed to a second input of the comparator device 10 via the output 91 of the digital/analogue converter stage 9. In the comparator device 10, the analogue voltage signal is compared with the analogue changeover-threshold signal and, according to this comparison, a binary output signal is created. The comparator device 10 preferably takes the form of a comparator circuit. The binary output signal is delivered via an output 11 of the comparator device 10.

The control stage 7 in the embodiment example shown in FIG. 1 is also equipped for the creation of an error signal in accordance with a second algorithm in the event that the first and second signal values obtained lie outside a specifiable tolerance range, and for the delivery of this error signal to an error-signal output 72. The tolerance range may preferably be matched to the established first and second signal values. For example, the tolerance range may be defined proportionally to an average of the first and second signal values formed over a plurality of pulse-shaped changes in the current signal, or their difference. By this means and by the very precise determination of the digital changeover-threshold signal, a very high insensitivity of the circuit configuration in accordance with the invention to interference and to fluctuations and tolerances in the current signal delivered by the magnetic-field sensor 1 can be achieved.

In the embodiment example shown in FIG. 1, the control stage (7) is also equipped for the creation, in accordance with a third algorithm, of a supply-voltage control signal from the first and second signal values obtained. In this third algorithm, the information in the error signal may preferably be evaluated and the supply voltage thereby set at a minimum possible value for the error-free creation of the output signal. The supply-voltage control signal is routed to the voltage-supply unit (50) via a control line 73 to control the supply voltage. As shown in the embodiment examples in FIG. 2 and FIG. 3, the voltage delivered by the reference-voltage source 54 may be adjusted advantageously.

With the exception of the magnetic-field sensor 1, the circuit components described are preferably combined in a common unit, the demarcation of which from the magnetic-field sensor 1 is indicated by a broken line 4.

The circuit configuration in accordance with the invention is preferably usable for applications of current interfaces in automotive electronics, in particular for throttle valve drives and controls, but also for rotation transducers in anti-lock braking systems. Many other applications are also possible.

LIST OF REFERENCE NUMBERS

1 Magnetic-field sensor
2 First terminal of magnetic-field sensor 1
3 Second terminal of magnetic-field sensor 1
4 Demarcation of common unit from magnetic-field sensor 1
5 Circuit unit, containing voltage-supply unit 50, measuring device 51 and signal-conditioning stage 52
6 Analogue/digital converter stage
7 Control stage
8 Memory device
9 Digital/analogue converter stage
10 Comparator device
11 Output of comparator device 10
50 Voltage-supply unit
51 Measuring device; measuring resistor
52 Signal-conditioning stage
53 Amplifier configuration, preferably operational amplifier
54 Reference-voltage source
55 Zener diode
56 Resistor
57 Capacitor
58 Arrow symbolizing supplying the magnetic-field sensor 1 with the stabilized supply voltage via the terminals 2, 3
59 Arrow symbolizing tapping of the pulse-shaped current signal from the magnetic-field sensor 1 via the terminals 2, 3
60 Connection for the measuring signal from the measuring device 51 to the signal-conditioning stage 52
61 Tap
62 First output for the analogue voltage signal from the signal-conditioning stage 52
63 Second output for the analogue voltage signal from the signal-conditioning stage 52
64 Line for the digital voltage signal
71 Line for the digital changeover-threshold signal
72 Error-signal output of the control stage 7 for the error signal
73 Control line for the supply-voltage control signal from the control stage 7 to the voltage-supply unit 50
91 Output of digital/analogue converter stage 9

The invention claimed is:

1. A circuit configuration for obtaining a binary output signal, comprising:
    a magnetic-field sensor, which is supplied at two terminals with a supply voltage and which delivers from these terminals a current signal essentially alternating in pulse shape between two current values;
    a voltage-supply unit to supply the magnetic-field sensor with a stabilized supply voltage;
    a measuring device for tapping the pulse-shaped current signal from the magnetic-field sensor and for delivering a measuring signal;
    a signal-conditioning stage for forming an analogue voltage signal from the measuring signal;
    an analogue/digital converter stage for obtaining a digital voltage signal from the analogue voltage signal;
    a control stage for obtaining a first and a second signal value from the digital voltage signal, wherein the signal values represent the two current values of the current signal, alternating in pulse shape, as supplied by the magnetic-field sensor for supplying the currently obtained first and second signal values to a memory device after every pulse-shaped change in the current signal for identifying a digital changeover-threshold signal in accordance with a first algorithm from the real-time first and second signal values, the memory device storing the currently obtained first and second signal values;

a digital/analogue converter stage for obtaining an analogue changeover-threshold signal from the digital changeover-threshold signal; and a comparator for comparing the analogue voltage signal with the analogue changeover-threshold signal and for creating the binary output signal in accordance this comparison.

2. A circuit configuration as claimed in claim 1, wherein the control stage is further equipped for the creation of an error signal in accordance with a second algorithm in the event that the first and second signal values obtained lie outside a specifiable tolerance range, and for delivery of this error signal to an error-signal output.

3. A circuit configuration as claimed in claim 1, wherein, to form the analogue voltage signal from the measuring signal, the signal-conditioning stage comprises a voltage-divider device with a series circuit containing a zener diode and a resistor 44, that the measuring signal is supplied to the series circuit and the analogue voltage signal is tapped off at the resistor.

4. A circuit configuration as claimed in claim 1, wherein, to form the analogue voltage signal from the measuring signal, the signal-conditioning stage comprises a high-pass circuit, to the input of which the measuring signal is supplied, and from the output of which the analogue voltage signal is delivered.

5. A circuit configuration for obtaining a binary output signal, comprising:

a magnetic-field sensor, which is supplied at two terminals with a supply voltage and which delivers from these terminals a current signal essentially alternating in pulse shape between two current values;

a voltage-supply unit to supply the magnetic-field sensor with a stabilized supply voltage;

a measuring device for tapping the pulse-shaped current signal from the magnetic-field sensor and for delivering a measuring signal;

a signal-conditioning stage for forming an analogue voltage signal from the measuring signal;

an analogue/digital converter stage for obtaining a digital voltage signal from the analogue voltage signal;

a control stage for obtaining a first and a second signal value from the digital voltage signal, wherein the signal values represent the two current values of the current signal, alternating in pulse shape, as supplied by the magnetic-field sensor for supplying the currently obtained first and second signal values to a memory device after every pulse-shaped change in the current signal for identifying a digital changeover-threshold signal in accordance with a first algorithm from the real-time first and second signal values, the memory device storing the currently obtained first and second signal values, wherein the control stage is further equipped for the creation, in accordance with a third algorithm, of a supply-voltage control signal from the first and second signal values obtained, and that the supply-voltage control signal is supplied to the voltage-supply unit for controlling the supply voltage to a minimum possible value for the error-free creation of the output signal;

a digital/analogue converter stage for obtaining an analogue changeover-threshold signal from the digital changeover-threshold signal; and a comparator for comparing the analogue voltage signal with the analogue changeover-threshold signal and for creating the binary output signal in accordance this comparison.

6. A circuit configuration as claimed in claim 5, wherein, to form the analogue voltage signal from the measuring signal, the signal-conditioning stage comprises a high-pass circuit, to the input of which the measuring signal is supplied, and from the output of which the analogue voltage signal is delivered.

7. A circuit configuration as claimed in claim 5, wherein, to form the analogue voltage signal from the measuring signal, the signal-conditioning stage comprises a voltage-divider device with a series circuit containing a zener diode and a resistor 44, that the measuring signal is supplied to the series circuit and the analogue voltage signal is tapped off at the resistor.

8. A circuit configuration as claimed in claim 5, wherein the control stage is further equipped for the creation of an error signal in accordance with a second algorithm in the event that the first and second signal values obtained lie outside a specifiable tolerance range, and for delivery of this error signal to an error-signal output.

9. A circuit configuration as claimed in claim 5, wherein the voltage-supply unit comprises an amplifier stage, with feedback via the measuring device, to supply the stabilized supply voltage.

10. A circuit configuration for obtaining a binary output signal, comprising:

a magnetic-field sensor, which is supplied at two terminals with a supply voltage and which delivers from these terminals a current signal essentially alternating in pulse shape between two current values;

a voltage-supply unit to supply the magnetic-field sensor with a stabilized supply voltage;

a measuring device for tapping the pulse-shaped current signal from the magnetic-field sensor and for delivering a measuring signal;

wherein the voltage-supply unit comprises an amplifier stage, with feedback via the measuring device, to supply the stabilized supply voltage;

a signal-conditioning stage for forming an analogue voltage signal from the measuring signal;

an analogue/digital converter stage for obtaining a digital voltage signal from the analogue voltage signal;

a control stage for obtaining a first and a second signal value from the digital voltage signal, wherein the signal values represent the two current values of the current signal, alternating in pulse shape, as supplied by the magnetic-field sensor for supplying the currently obtained first and second signal values to a memory device after every pulse-shaped change in the current signal for identifying a digital changeover-threshold signal in accordance with a first algorithm from the real-time first and second signal values, the memory device storing the currently obtained first and second signal values;

a digital/analogue converter stage for obtaining an analogue changeover-threshold signal from the digital changeover-threshold signal; and a comparator for comparing the analogue voltage signal with the analogue changeover-threshold signal and for creating the binary output signal in accordance this comparison.

11. A circuit configuration as claimed in claim 10, wherein, to form the analogue voltage signal from the measuring signal, the signal-conditioning stage comprises a high-pass circuit, to the input of which the measuring signal is supplied, and from the output of which the analogue voltage signal is delivered.

12. A circuit configuration as claimed in claim 10, wherein, to form the analogue voltage signal from the measuring signal, the signal-conditioning stage comprises a voltage-divider device with a series circuit containing a zener diode and a resistor 44, that the measuring signal is supplied to the series circuit and the analogue voltage signal is tapped off at the resistor.

13. A circuit configuration as claimed in claim 10, wherein the control stage is further equipped for the creation of an error signal in accordance with a second algorithm in the event that the first and second signal values obtained lie outside a specifiable tolerance range, and for delivery of this error signal to an error-signal output.

14. A circuit configuration as claimed in claim 10, wherein the control stage is further equipped for the creation, in accordance with a third algorithm, of a supply-voltage control signal from the first and second signal values obtained, and that the supply-voltage control signal is supplied to the voltage-supply unit for controlling the supply voltage to a minimum possible value for the error-free creation of the output signal.

* * * * *